United States Patent
Gong et al.

(10) Patent No.: US 12,026,605 B2
(45) Date of Patent: Jul. 2, 2024

(54) FeFET UNIT CELLS FOR NEUROMORPHIC COMPUTING

(71) Applicant: INTERNATIONAL BUSINESS MACHINES CORPORATION, Armonk, NY (US)

(72) Inventors: Nanbo Gong, White Plains, NY (US); Takashi Ando, Eastchester, NY (US); Bahman Hekmatshoartabari, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 881 days.

(21) Appl. No.: 17/110,429

(22) Filed: Dec. 3, 2020

(65) Prior Publication Data

US 2022/0180156 A1    Jun. 9, 2022

(51) Int. Cl.
| | |
|---|---|
| *G11C 11/00* | (2006.01) |
| *G06N 3/063* | (2023.01) |
| *G06N 3/08* | (2023.01) |
| *G11C 11/22* | (2006.01) |
| *G11C 11/54* | (2006.01) |
| *H10B 51/30* | (2023.01) |

(52) U.S. Cl.
CPC .............. *G06N 3/063* (2013.01); *G06N 3/08* (2013.01); *G11C 11/223* (2013.01); *G11C 11/2273* (2013.01); *G11C 11/2275* (2013.01); *G11C 11/54* (2013.01); *H10B 51/30* (2023.02)

(58) Field of Classification Search
CPC ... G11C 11/223; G11C 11/5657; G11C 11/54; G06N 3/08; G06N 3/049; G06N 3/088
See application file for complete search history.

(56) References Cited

U.S. PATENT DOCUMENTS

| | | |
|---|---|---|
| 6,370,056 B1 | 4/2002 | Chen et al. |
| 6,787,830 B2 | 9/2004 | Shimada et al. |
| | (Continued) | |

OTHER PUBLICATIONS

Jerry et al., "Ferroelectric FET analog synapse for acceleration of deep neural network training", 63rd IEEE International Electron Devices Meeting. Dec. 2-6, 2017. https://asu.pure.elsevier.com/en/publications/ferroelectric-fet-analog-synapse-for-acceleration-of-deep-neural-. pp. 1-3.

(Continued)

*Primary Examiner* — Uyen Smet
(74) *Attorney, Agent, or Firm* — Tutunjian & Bitetto, P.C.; Samuel Waldbaum

(57) ABSTRACT

A circuit structure includes a first ferroelectric field effect transistor (FeFET) having a first gate electrode, a first source electrode, and a first drain electrode and a second FeFET having a second gate electrode, a second source electrode, and a second drain electrode. The first gate electrode is connected to a wordline, and the first source electrode and the second source electrode are connected to a bitline. The first drain electrode is connected to the second gate electrode and the second drain electrode is connected to a bias line. A weight synapse structure is constructed by combining two circuit structures. A plurality of weight synapse structures are incorporated into a crossbar array.

20 Claims, 10 Drawing Sheets

(56) References Cited

U.S. PATENT DOCUMENTS

| | | | |
|---|---|---|---|
| 8,081,499 B2* | 12/2011 | Takahashi | G11C 11/22 |
| | | | 365/145 |
| 9,530,794 B2 | 12/2016 | Ramaswamy et al. | |
| 9,818,848 B2 | 11/2017 | Sun et al. | |
| 2018/0012123 A1 | 1/2018 | Han et al. | |
| 2018/0349761 A1* | 12/2018 | Lee | G06N 3/049 |
| 2020/0192970 A1* | 6/2020 | Ma | G11C 11/54 |
| 2021/0066318 A1* | 3/2021 | Chang | G11C 11/223 |

OTHER PUBLICATIONS

Gokmen et al., "Acceleration of Deep Neural Network Training with Resistive Cross-Point Devices: Design Considerations," Neuroscience. Jul. 21, 2016. https://doi.org/10.3389/fnins.2016.00333. pp. 1-13.

Luo et al., "Benchmark of Ferroelectric Transistor-Based Hybrid Precision Synapse for Neural Network Accelerator", IEEE Journal on Exploratory Solid-State Computational Devices and Circuits. Jun. 26, 2019. vol. 5, No. 2. pp. 142-150.

Mulaosmanovic et al., "Novel ferroelectric FET based synapse for neuromorphic systems", 2017 Symposium on VLSI Technology. Jun. 5-8, 2017. https://ieeexplore.ieee.org/abstrace/document/7998165. pp. 1-3.

Obradovic et al., "A Multi-Bit Neuromorphic Weight Cell using Ferroelectric FETs, suitable for SoC Integration", arXiv:1710.08034v1 [cs.ET]. Oct. 22, 2017. pp. 1-9.

Yin et al., "Ferroelectric FETs-Based Nonvolatile Logic-in-Memory Circuits", IEEE Transactions on Very Large Scale Integration (VLSI) Systems. vol. 27, No. 1. Oct. 4, 2018. https://www.researchgate.net/publication/328081773. pp. 1-15.

* cited by examiner

FeFET UNIT CELLS FOR NEUROMORPHIC COMPUTING

BACKGROUND

The present invention relates generally to semiconductor devices, and more specifically, to ferroelectric field effect transistor (FeFET) unit cells for neuromorphic computing.

FeFETs are emerging devices, in which a ferroelectric layer (FE) is integrated in a gate stack of a transistor above the dielectric (DE). An optional metal can also be used in between FE and DE layers. The polarization of FE couples with that of the underlying FET leading to unique characteristics such as non-volatile transistor operation (due to P retention in the absence of external E). Experimental studies have shown analog computing or nonvolatile (memory) characteristics for FeFETs by employing design-time/static device optimizations, for instance by modifying the composition of the gate-stack.

SUMMARY

In accordance with an embodiment, a circuit structure is provided. The circuit structure includes a first ferroelectric field effect transistor (FeFET) including a first gate electrode, a first source electrode, and a first drain electrode and a second FeFET including a second gate electrode, a second source electrode, and a second drain electrode, wherein the first gate electrode is connected to a wordline and wherein the first source electrode and the second source electrode are connected to a bitline.

In accordance with another embodiment, a weight synapse structure is provided. The weight synapse structure includes a first circuit structure incorporated between a first wordline and a first bitline, wherein the first circuit structure includes a first ferroelectric field effect transistor (FeFET) and a second FeFET and a second circuit structure incorporated between a second wordline and a second bitline, wherein the second circuit structure includes a third FeFET and a fourth FeFET, the first circuit structure electrically connected to the second circuit structure by electrically connecting the first wordline to the second wordline to define a single synapse.

In accordance with yet another embodiment, a method is provided. The method includes constructing a first ferroelectric field effect transistor (FeFET) including a first gate electrode, a first source electrode, and a first drain electrode, constructing a second FeFET including a second gate electrode, a second source electrode, and a second drain electrode, the first and second FeFETs combined to form a first circuit structure, connecting the first gate electrode to a first wordline, and connecting the first source electrode and the second source electrode to a first bitline.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for employing a unit cell for improving linearity for neuromorphic computing. The unit cell includes two ferroelectric field effect transistors (FeFETs). In the unit cell, one FeFET serves as an access (or pass) transistor and the other FeFET is employed to store information that is proportional to conductance (G). A weight is represented by two unit cells, that is, four FeFETs. The weight is represented proportional to the difference of (G+, G−). The FeFETs can be either an n-type field effect transistor (nFET) or a p-type field effect transistor (pFET) or a combination thereof.

Linearity is a factor for analog memory elements for the weight update. For online training purposes, the pulse needs to have the same amplitude and duration. However, it is still a challenge to obtain the necessary linearity when using existing FeFETs under voltage pulses. In one methodology, the gate voltage of the FeFET synapse can be adjusted in order to improve the linearity response. This can be achieved by using an FeFET as a pass transistor so that the voltage applied to the synapse is modulated.

Embodiments in accordance with the present invention provide methods and devices for a structure including two FeFETs, one employed as a pass transistor and the other employed for analog computing to improve linearity of the weight update. One FeFET is employed for potentiation and the other FeFET is employed for depression. As a result, the exemplary embodiments of the present invention focus on a two FeFET unit-cell structure to improve linearity for neuromorphic computing, where two ferroelectric memories are used for training purposes.

Examples of semiconductor materials that can be used in forming such FeFET include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
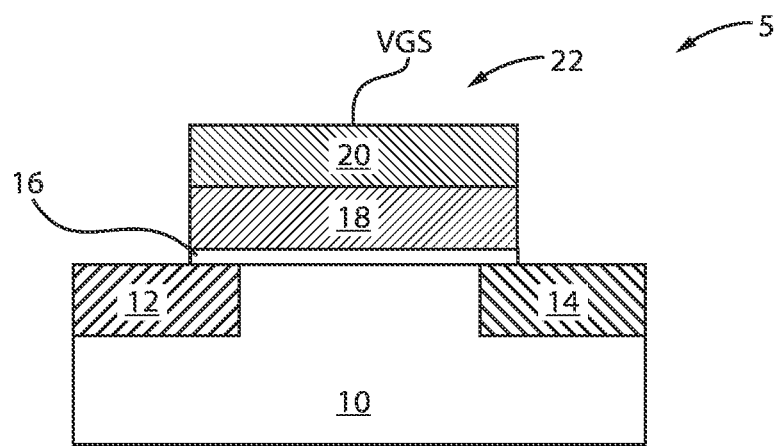
FIG. 1 is a ferroelectric field effect transistor (FeFET) structure.

FIG. 1 is a ferroelectric field effect transistor (FeFET) structure.

The FeFET device 5 includes a source region 12 and a drain region 14 formed over portions of a substrate 10. An interfacial layer (IL) 16 is formed in direct contact with a top surface of the substrate 10, the source region 12, and the drain region 14. A ferroelectric oxide layer 18 is formed over the IL 16. A top electrode 20 is then formed over the ferroelectric oxide layer 18. A gate voltage 22 ($V_{GS}$) can be applied via the top electrode 20.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The top electrode 20 can include a conductive material, such as Cu, Al, Ag, Au, Pt, W, Ta, Ru, etc. In some embodiments, the top electrode 20 can include nitrides such as TiN, TaN, etc.

The ferroelectric oxide layer 18 can include a hafnium oxide ($HfO_2$) layer, or $HfO_2$ with dopant, such as Si, Al, Zr, N, etc. The ferroelectric oxide layer 18 can include, e.g., $HfO_2$ in an orthorhombic phase (ferroelectric phase).

Figure 2:
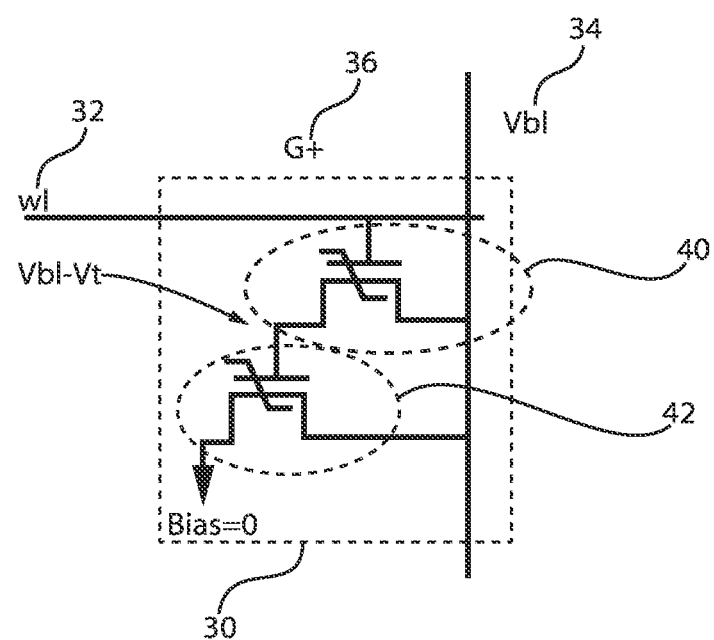
FIG. 2 is a unit cell including two FeFETs, in accordance with an embodiment of the present invention.

FIG. 2 is a unit cell including two FeFETs, in accordance with an embodiment of the present invention.

The unit cell 30 includes two FeFETs, that is, a first FeFET 40 and second FeFET 42. The first FeFET 40 serves as a pass transistor and the second FeFET 42 serves as a non-volatile memory (NVM) for analog computing.

In various example embodiments, the unit cell 30 is incorporated between a bitline 34 and a wordline 32. Thus, an array can be obtained by perpendicular conductive wordlines (rows) 32 and bitlines (columns) 34, where a unit cell structure 30 exists at the intersection between each row and column. The cell structure 30 can be accessed for read and write by biasing the corresponding wordline 32 and bitline 34. The unit cell 30 represents a conductance (G) value 36.

Figure 3:
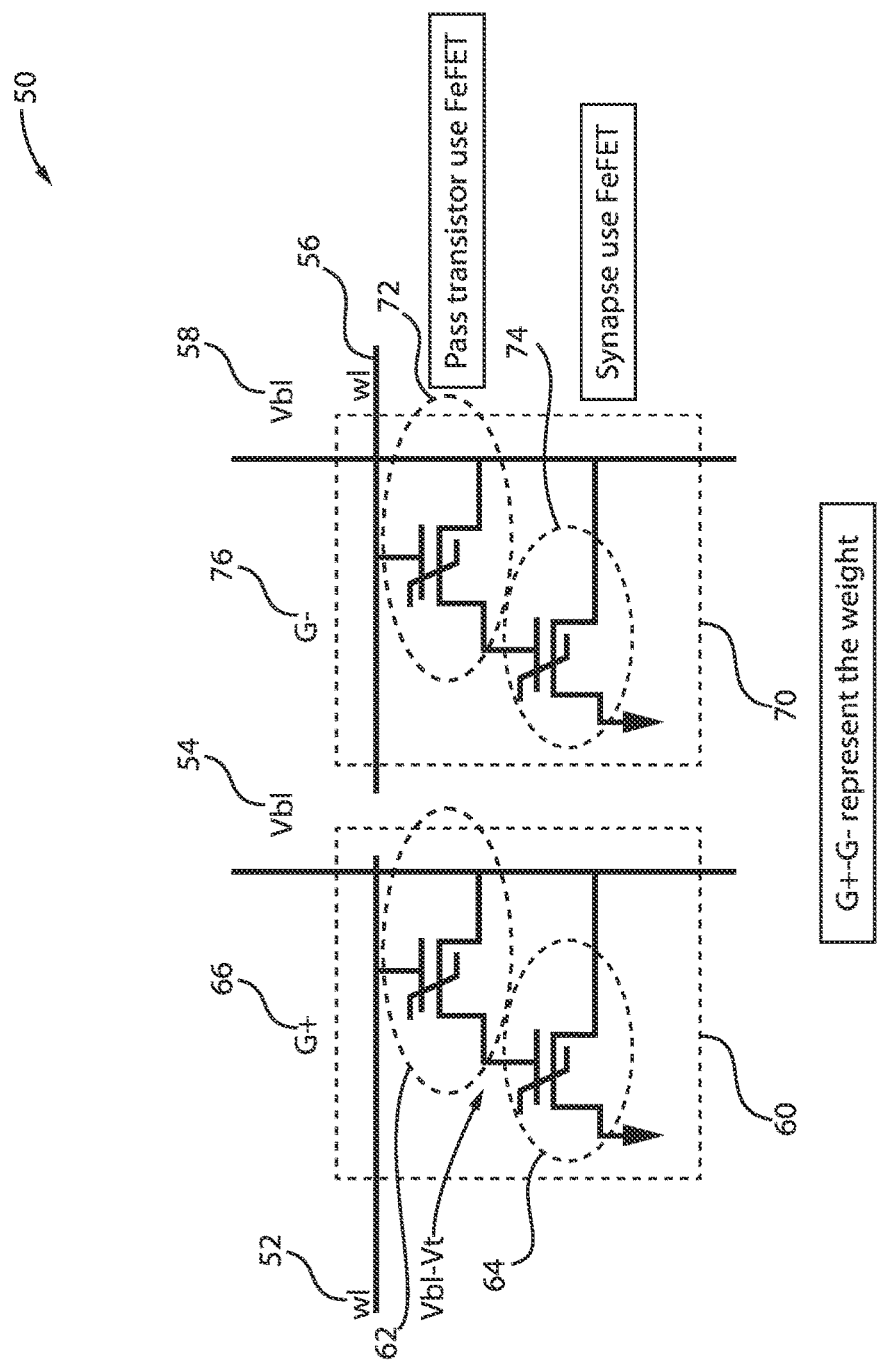
FIG. 3 is a synapse weight including four FeFETs, in accordance with an embodiment of the present invention.

FIG. 3 is a synapse weight including four FeFETs, in accordance with an embodiment of the present invention.

The weight synapse 50 includes two unit cells and four FeFETs. In particular G+ (66) or unit cell 60 includes two FeFETs 62, 64 and G− (76) or unit cell 70 includes two FeFETs 72, 74. FeFET 62 of unit cell 60 is a pass transistor and FeFET 64 of unit cell 60 is a NVM for analog computing. Similarly, FeFET 72 of unit cell 70 is a pass transistor and FeFET 74 of unit cell 70 is a NVM for analog computing. Each unit cell includes a wordline and a bitline. For example, unit cell 60 includes wordline 52 and bitline 54, whereas unit cell 70 includes wordline 56 and bitline 58.

Therefore according to FIGS. 1-3, an FeFET device 5 includes a single-transistor structure (source region 12, drain, gate region 14, substrate 10) with ferroelectric oxide layer 18 serving as the gate dielectric. The two FeFETs (one serving as a pass transistor and one serving as a NVM for analog computing) represent a unit cell structure 30 representing a conductance (G) value that is used for analog computing. The G+ (two FeFETs) and G− (additional two FeFETs) together represent a synapse weight 50 where W is proportional to the difference between G+ and G−. The two-unit-cell-represent-one-synapse concept is used in phase change memory (PCM)-based synapse applications where two PCM devices represent one weight (G+-G-). According to the exemplary embodiments of the present invention, two unit cells are needed to represent a synapse, and for each unit cell, two FeFETs are needed (one pass transistor, and one NVM for the analog computing).

Figure 4:
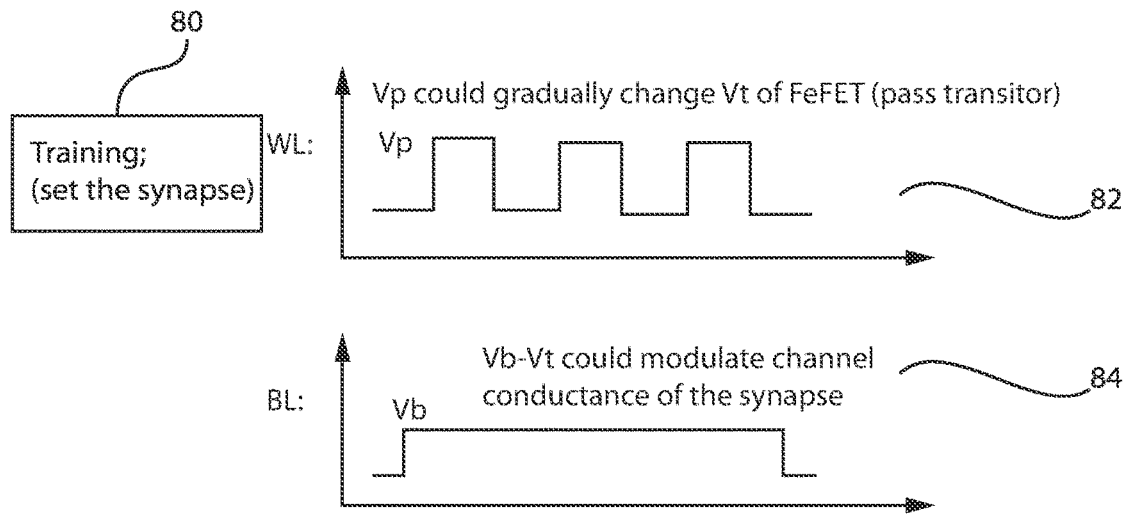
FIG. 4 is a block/flow diagram for training or setting a synapse weight, in accordance with an embodiment of the present invention.

FIG. 4 is a block/flow diagram for training or setting a synapse weight, in accordance with an embodiment of the present invention.

For training 80, when the synapse is set, regarding the wordline 82, Vp could gradually change Vt of the FeFET (pass transistor). For the bitline 84, Vb-Vt could modulate channel conductance of the synapse. Thus, to program the FeFET devices, positive voltage pulses exceeding the threshold voltage Vt have to be applied. In this way, a sufficient electric field is generated over the ferroelectric layer to induce polarization reversal. Thus, for each incoming positive pulse Vp, the FeFET turns on.

Figure 5:
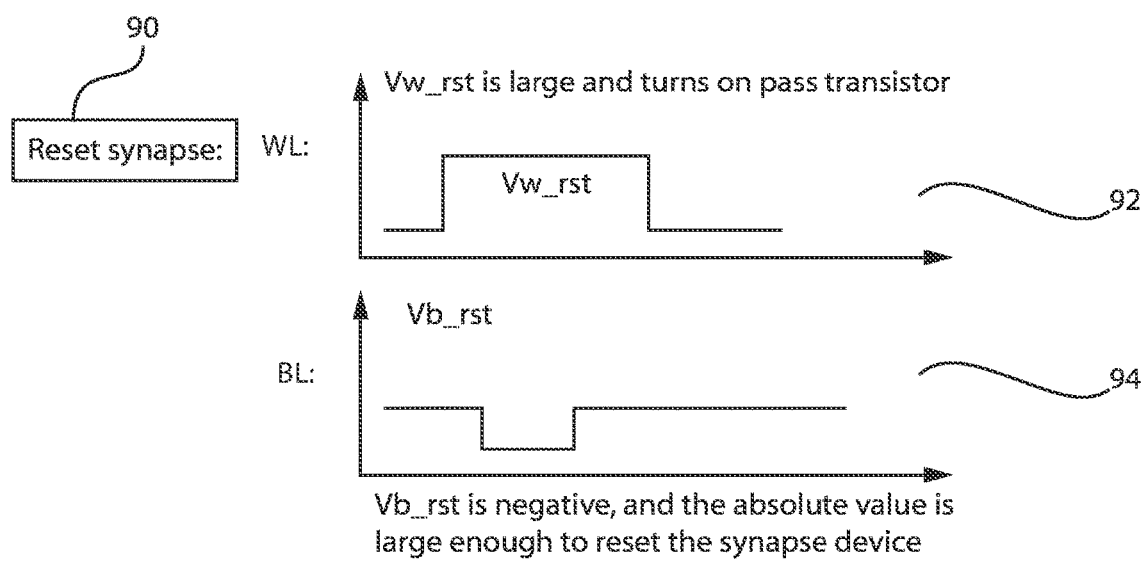
FIG. 5 is a block/flow diagram for resetting the synapse weight, in accordance with an embodiment of the present invention.

FIG. 5 is a block/flow diagram for resetting the synapse weight, in accordance with an embodiment of the present invention.

For synapse reset 90, regarding the wordline 92, $V_{w\_rst}$ is large and turns on the pass transistor. Regarding the bitline 94, $V_{b\_rst}$ is negative and the absolute value is large enough to reset the synapse device.

Figure 6:
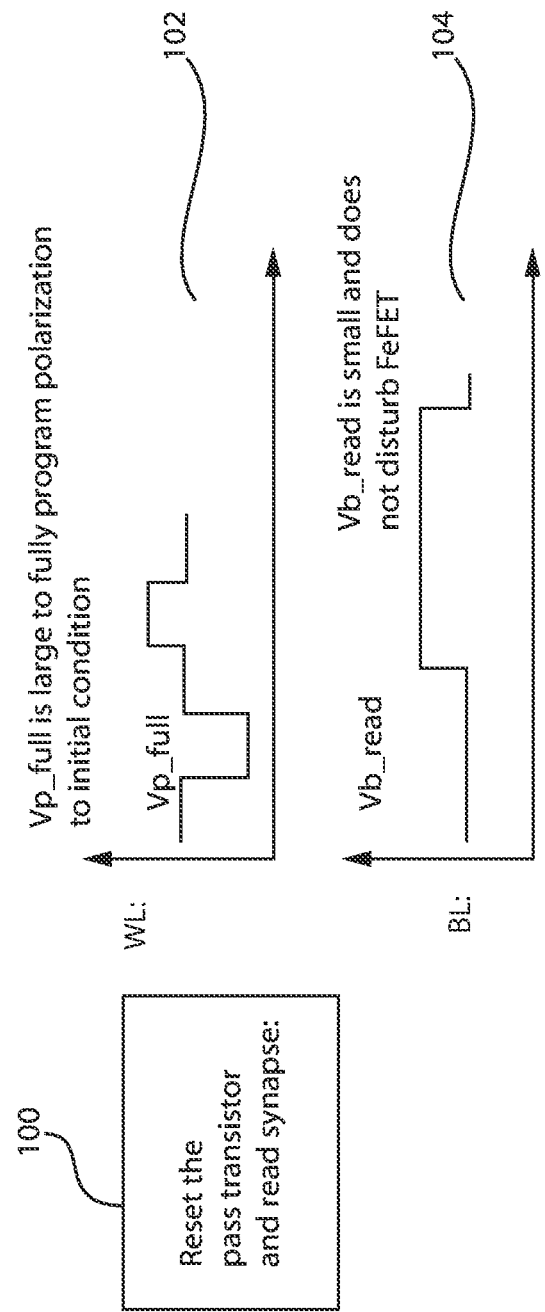
FIG. 6 is a block/flow diagram for resetting the pass transistor and reading the synapse weight, in accordance with an embodiment of the present invention.

FIG. 6 is a block/flow diagram for resetting the pass transistor and reading the synapse weight, in accordance with an embodiment of the present invention.

For reading of the synapse 100, regarding the wordline 102, $V_{p\_full}$ is large to fully program polarization to an initial condition. Regarding the bitlines 104, $V_{b\_read}$ is small and does not disturb the FeFET.

Figure 7:
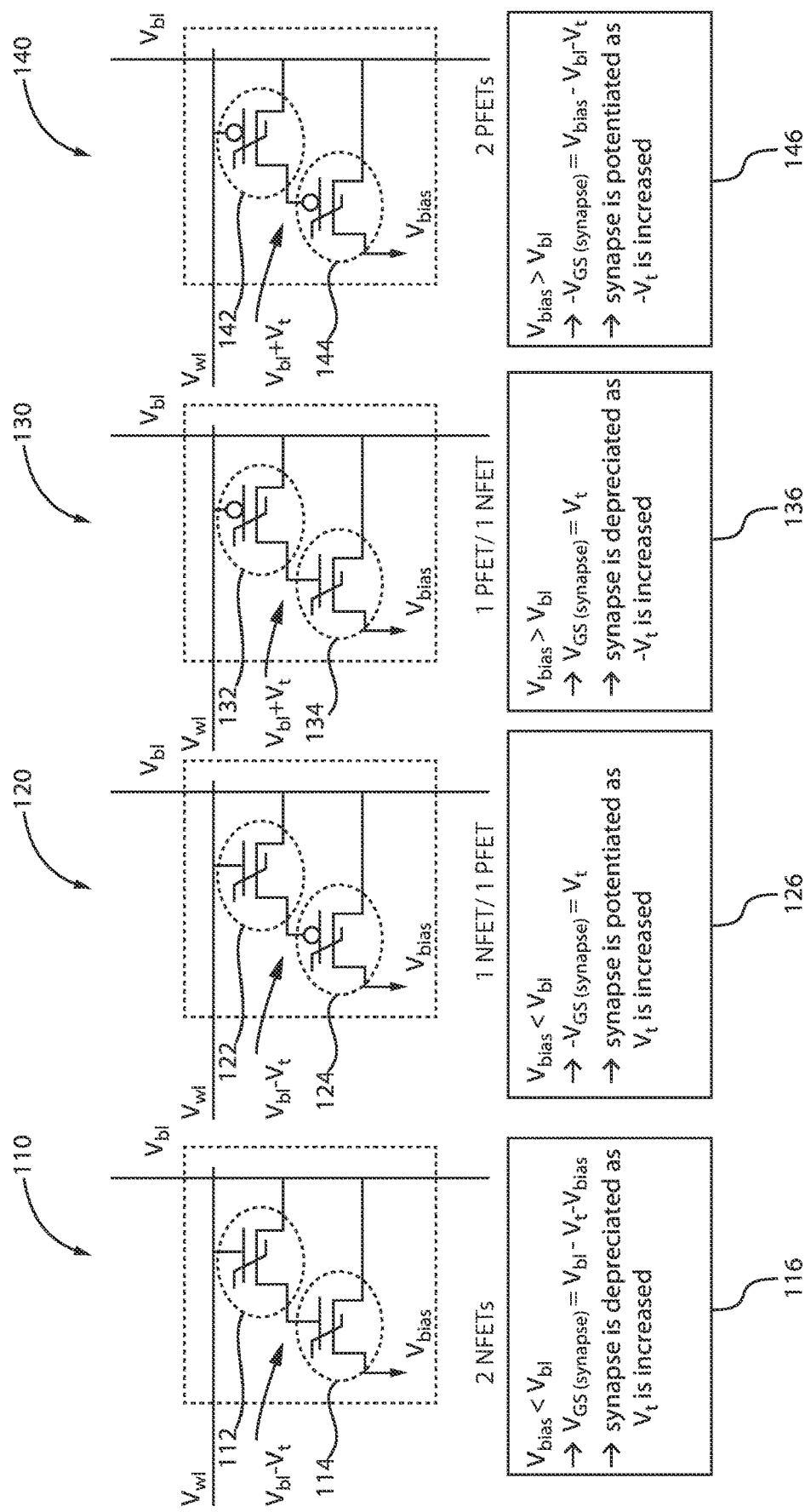
FIG. 7 are n-type field effect transistor (nFET) and p-type field effect transistor (pFET) configurations with a first set of bias conditions, in accordance with an embodiment of the present invention.

FIG. 7 are nFET and pFET configurations with a first set of bias conditions, in accordance with an embodiment of the present invention.

In a first configuration 110, two nFETs 112, 114 are connected to each other in a unit cell. In a first set of conditions 116, $V_{bias}<V_{bl}$ and $V_{GS\ (synapse)}=V_{bl}-V_t-V_{bias}$, where the synapse is depreciated as $V_t$ is increased. Note that if $V_{bias}$ is chosen to be 0, this configuration becomes equivalent to that described with respect to FIG. 2.

In a second configuration 120, one nFET 122 and one pFET 124 are connected to each other in a unit cell. In a first set of conditions 126, $V_{bias}<V_{bl}$ and $-V_{GS\ (synapse)}=V_t$, where the synapse is potentiated as $V_t$ is increased.

In a third configuration 130, one pFET 132 and one nFET 134 are connected to each other in a unit cell. In a first set of conditions 136, $V_{bias}>V_{bl}$ and $V_{GS\ (synapse)}=V_t$, where the synapse is depreciated as $-V_t$ is increased.

In a fourth configuration 140, two pFETs 142, 144 are connected to each other in a unit cell. In a first set of conditions 146, $V_{bias}>V_{bl}$ and $V_{GS\ (synapse)}=V_{bias}-V_{bl}-V_t$, where the synapse is potentiated as $-V_t$ is increased.

Figure 8:
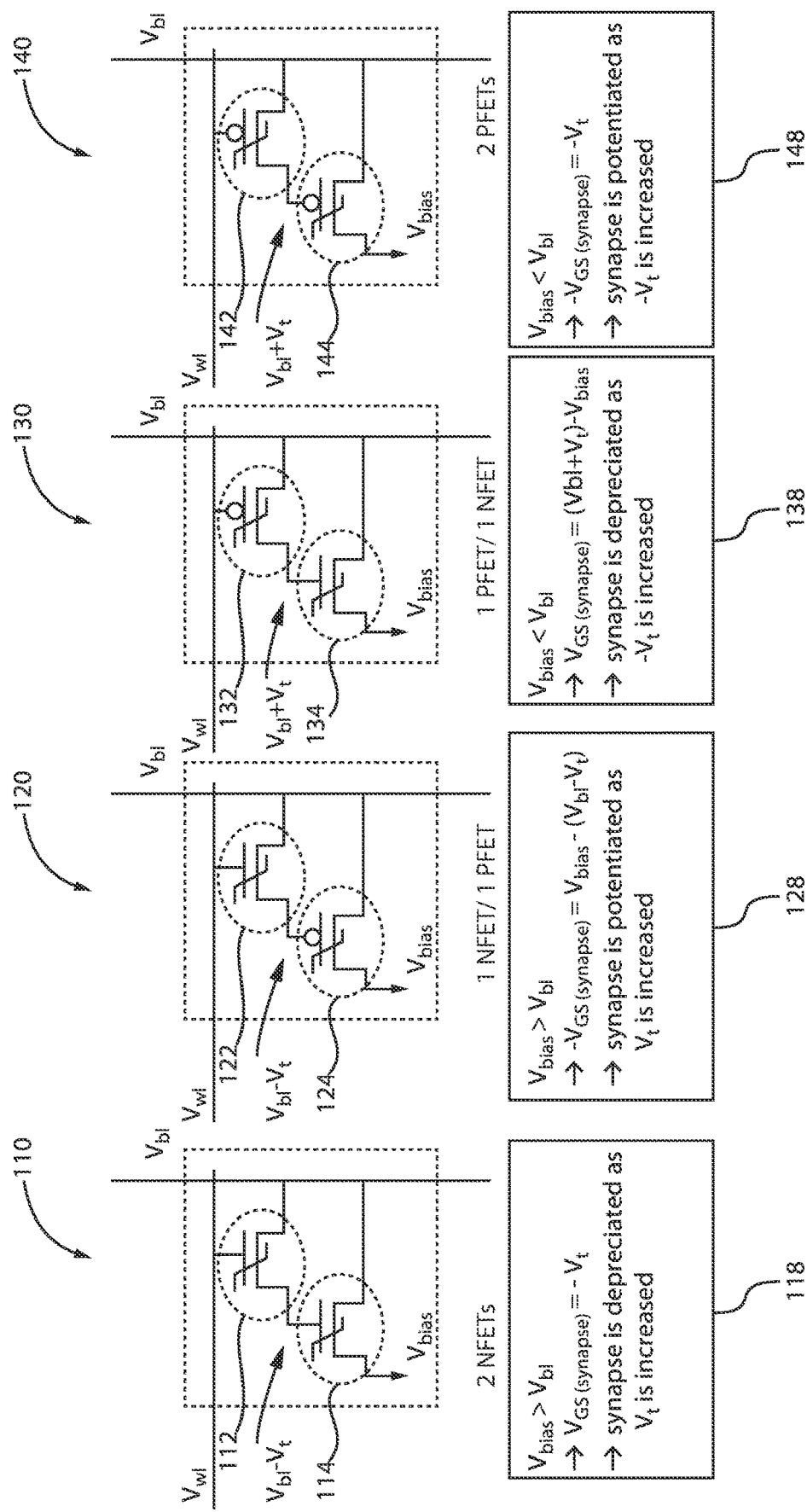
FIG. 8 are nFET and pFET configurations with a second set of bias conditions, in accordance with an embodiment of the present invention.

FIG. 8 are nFET and pFET configurations with a second set of bias conditions, in accordance with an embodiment of the present invention.

In a first configuration 110, two nFETs 112, 114 are connected to each other in a unit cell. In a second set of conditions 118, $V_{bias}>V_{bl}$ and $V_{GS\ (synapse)}=-V_t$, where the synapse is depreciated as $V_t$ is increased.

In a second configuration 120, one nFET 122 and one pFET 124 are connected to each other in a unit cell. In a second set of conditions 128, $V_{bias}>V_{bl}$ and $-V_{GS\ (synapse)}=V_{bias}-(V_{bl}-V_t)$, where the synapse is potentiated as $V_t$ is increased.

In a third configuration 130, one pFET 132 and one nFET 134 are connected to each other in a unit cell. In a first set of conditions 138, $V_{bias}<V_{bl}$ and $V_{GS\ (synapse)}=(V_{bl}+V_t)-V_{bias}$, where the synapse is depreciated as $-V_t$ is increased.

In a fourth configuration 140, two pFETs 142, 144 are connected to each other in a unit cell. In a first set of conditions 148, $V_{bias}<V_{bl}$ and $-V_{GS\ (synapse)}=-V_t$, where the synapse is potentiated as $-V_t$ is increased.

In one non-limiting example of a train of pulses of equal amplitude (V) and duration, where n is the number of pulses applied after resetting the FeFETs, it is assumed that channel conductance, and, therefore, $V_t$ factorizes over V and n, based on empirical FeFET expressions:

$$\Delta V_{t,PASS}=V_{t,PASS}-V_{t0,PASS}=\alpha_1 V[1-\exp(-\lambda_1 n)],$$

where $\alpha_1$, $\lambda_1$ are empirical parameters.

Thus, $\Delta V_t$ of the synapse can be expressed as:

$$\Delta V_{t,SYNAPSE}=\alpha_2(C+\Delta V_{t,PASS})[1-\exp(-\lambda_2 n)],$$

where C is a constant depending on $V_{t0,\ PASS}$, $V_{bias}$ and $V_{bl}$.

As a result, $V_{effective,\ SYNAPSE}=C+\alpha_1 V[1-\exp(-\lambda_1 n)]$ which increases as a function of n, and therefore improves the linearity.

Quantitatively, without a pass transistor FeFET, synapse linearity at $n\approx 1/\lambda_2$ would be $(1-\exp(-1))\times 100\approx 64\%$.

With the addition of the pass transistor FeFET, synapse linearity is increased by a factor of $[1+\alpha_1(V/C)\cdot(1-\exp(-\lambda_1/\lambda_2))]$, which is about $[1+0.64\alpha_1(V/C)]$ for $\lambda_1\approx\lambda_2$.

Figure 9:
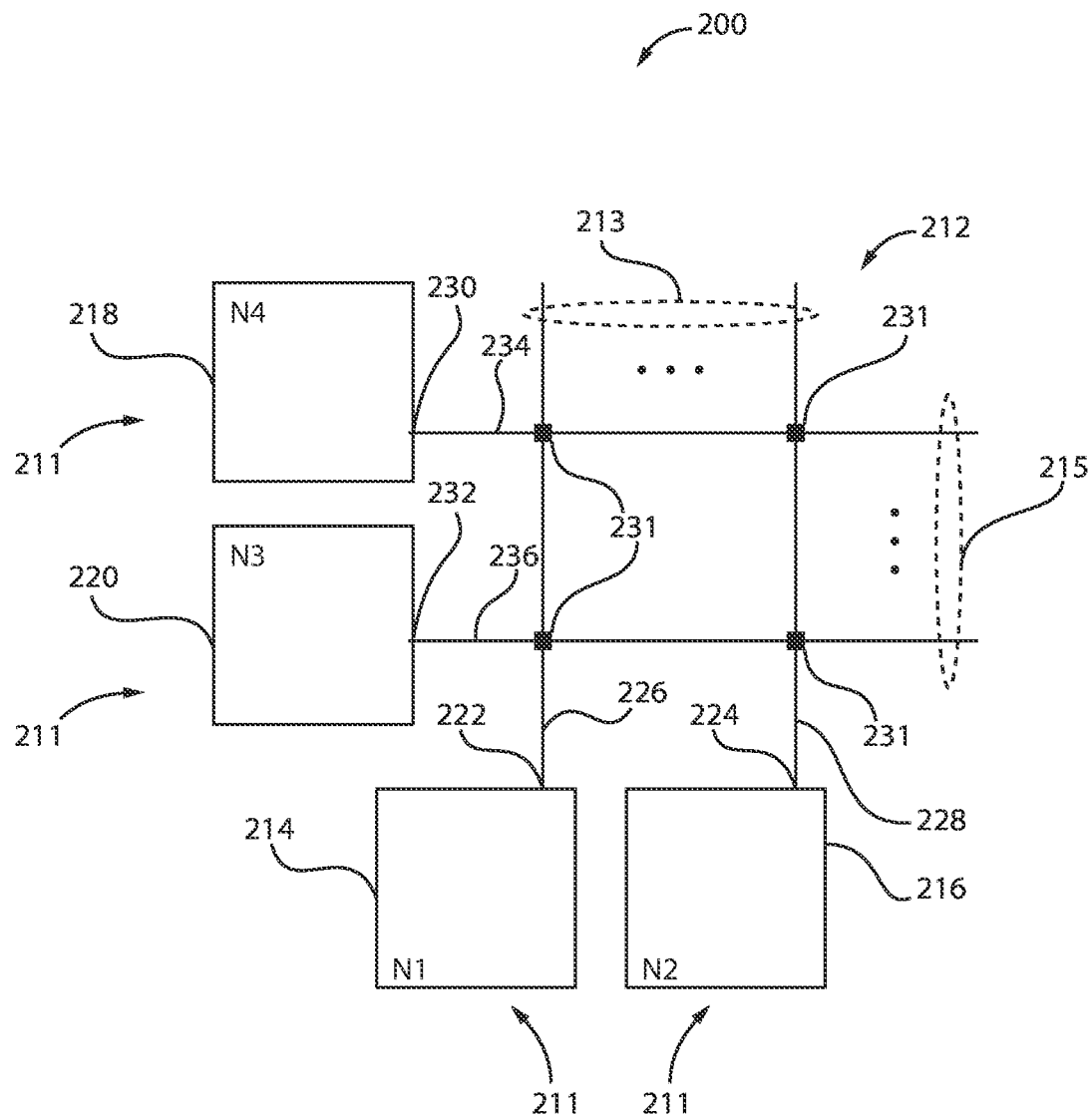
FIG. 9 is an exemplary neuromorphic and synaptronic network including a crossbar of electronic synapses interconnecting electronic neurons and axons, in accordance with an embodiment of the present invention.

FIG. 9 is an exemplary neuromorphic and synaptronic network including a crossbar of electronic synapses interconnecting electronic neurons and axons, in accordance with an embodiment of the present invention.

The example tile circuit 200 has a crossbar 212 in accordance with an embodiment of the invention. In one example, the overall circuit can include an "ultra-dense crossbar array" that can have a pitch in the range of about 10 nm to 500 nm. However, one skilled in the art can contemplate smaller and larger pitches as well. The neuromorphic and synaptronic circuit 200 includes the crossbar 212 interconnecting a plurality of digital neurons 211 including neurons 214, 216, 218 and 220. These neurons 211 are also referred to herein as "electronic neurons." For illustration purposes, the example circuit 200 provides symmetric connections between the two pairs of neurons (e.g., N1 and N3). However, embodiments of the invention are not only useful with such symmetric connection of neurons, but also useful with asymmetric connection of neurons (neurons N1 and N3 need not be connected with the same connection). The cross-bar in a tile accommodates the appropriate ratio of synapses to neurons, and, hence, need not be square.

In the example circuit 200, the neurons 211 are connected to the crossbar 212 via dendrite paths/wires (dendrites) 213 such as dendrites 226 and 228. Neurons 211 are also connected to the crossbar 212 via axon paths/wires (axons) 215 such as axons 234 and 236. Neurons 214 and 216 are dendritic neurons and neurons 218 and 220 are axonal neurons connected with axons 213. Specifically, neurons 214 and 216 are shown with outputs 222 and 224 connected to dendrites (e.g., bitlines) 226 and 228, respectively. Axonal neurons 218 and 220 are shown with outputs 230 and 232 connected to axons (e.g., wordlines or access lines) 234 and 236, respectively.

When any of the neurons 214, 216, 218 and 220 fire, they will send a pulse out to their axonal and to their dendritic connections. Each synapse provides contact between an axon of a neuron and a dendrite on another neuron and with respect to the synapse, the two neurons are respectively called pre-synaptic and post-synaptic.

Each connection between dendrites 226, 228 and axons 234, 236 are made through a digital synapse device 231 (synapse). The junctions where the synapse devices are located can be referred to herein as "cross-point junctions." In general, in accordance with an embodiment of the invention, neurons 214 and 216 will "fire" (transmit a pulse) in response to the inputs they receive from axonal input connections (not shown) exceeding a threshold. Each single synapse 231 can include a first circuit structure and a second circuit structure electrically connected to each other, either directly or indirectly through peripheral circuitry. The first circuit structure can be referred to as a first unit cell and the second circuit structure can be referred to as a second unit cell. Each single synapse 231 includes four FeFETs, as illustrated in FIG. 3. Thus, in one example, one or more weight synapse structures of FIG. 3 are incorporated into the neuromorphic and synaptronic network of FIG. 9.

Neurons 218 and 220 will "fire" (transmit a pulse) in response to the inputs they receive from external input connections (not shown), usually from other neurons, exceeding a threshold. In one embodiment, when neurons 214 and 216 fire, they maintain a postsynaptic spike-timing-dependent plasticity (STDP) (post-STDP) variable that decays. For example, in one embodiment, the decay period can be 50 μs (which is 1000× shorter than that of actual biological systems, corresponding to 1000× higher operation speed). The post-STDP variable is employed to achieve STDP by encoding the time since the last firing of the associated neuron. Such STDP is used to control long-term potentiation or "potentiation," which in this context is defined as increasing synaptic conductance. When neurons 218, 220 fire they maintain a pre-STDP (presynaptic-STDP) variable that decays in a similar fashion as that of neurons 214 and 216.

Pre-STDP and post-STDP variables can decay according to exponential, linear, polynomial, or quadratic functions, for example. In another embodiment of the invention, the variables can increase instead of decreasing over time. In any event, this variable can be used to achieve STDP by encoding the time since the last firing of the associated neuron. STDP is used to control long-term depression or "depression," which in this context is defined as decreasing synaptic conductance. Note that the roles of pre-STDP and post-STDP variables can be reversed with pre-STDP implementing potentiation and post-STDP implementing depression.

An external two-way communication environment can supply sensory inputs and consume motor outputs. Digital neurons 211 implemented using complementary metal oxide semiconductor (CMOS) logic gates receive spike inputs and integrate them. In one embodiment, the neurons 211 include comparator circuits that generate spikes when the integrated input exceeds a threshold. In one embodiment, synapses are implemented using flash memory cells, wherein each neuron 211 can be an excitatory or inhibitory neuron (or both). Each learning rule on each neuron axon and dendrite are reconfigurable as described below. This assumes a transposable access to the crossbar memory array. Neurons that spike are selected one at a time sending spike events to corresponding axons, where axons could reside on the core or somewhere else in a larger system with many cores.

The term electronic neuron as used herein represents an architecture configured to simulate a biological neuron. An electronic neuron creates connections between processing elements that are roughly functionally equivalent to neurons of a biological brain. As such, a neuromorphic and synaptronic system including electronic neurons according to embodiments of the invention can include various electronic circuits that are modeled on biological neurons, though they can operate on a faster time scale (e.g., 1000×) than their biological counterparts in many useful embodiments. Further, a neuromorphic and synaptronic system including electronic neurons according to embodiments of the invention can include various processing elements (including computer simulations) that are modeled on biological neurons. Although certain illustrative embodiments of the invention are described herein using electronic neurons including electronic circuits, the present invention is not limited to electronic circuits. A neuromorphic and synaptronic system according to embodiments of the invention can be implemented as a neuromorphic and synaptronic architecture including circuitry, and additionally as a computer simulation. Indeed, embodiments of the invention can take the form of an entirely hardware embodiment, an entirely software embodiment, or an embodiment including both hardware and software elements.

Figure 10:
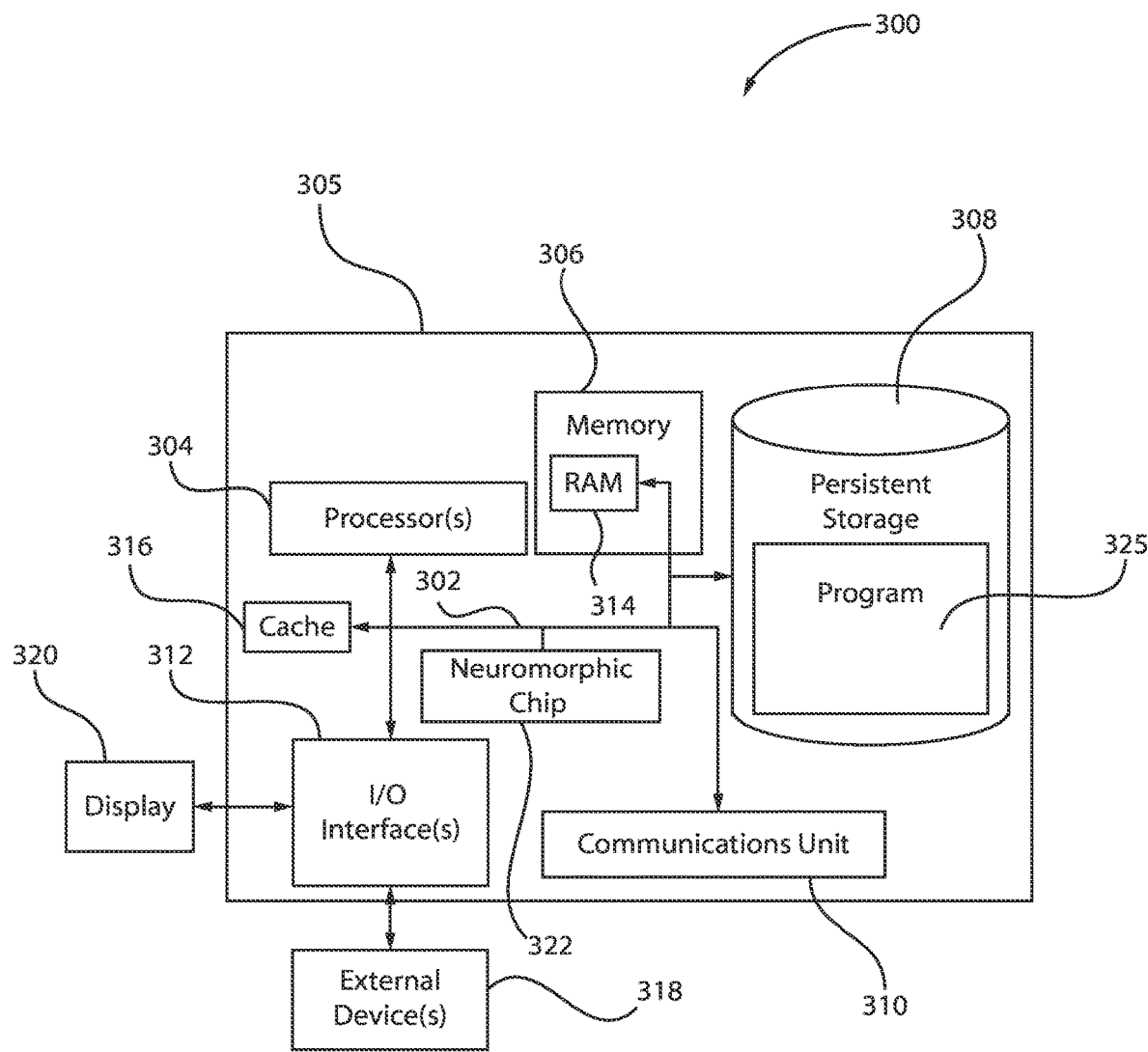
FIG. 10 is a block diagram of components of a computing system including a computing device and a neuromorphic chip capable of employing the unit cell and/or synapse weight, in accordance with an embodiment of the present invention.

FIG. 10 is a block diagram of components of a computing system including a computing device and a neuromorphic chip capable of employing the unit cell and/or synapse weight, in accordance with an embodiment of the present invention.

FIG. 10 depicts a block diagram of components of system 300, which includes computing device 305. It should be appreciated that FIG. 10 provides only an illustration of one implementation and does not imply any limitations with regard to the environments in which different embodiments can be implemented. Many modifications to the depicted environment can be made.

Computing device 305 includes communications fabric 302, which provides communications between computer processor(s) 304, memory 306, persistent storage 308, communications unit 310, and input/output (I/O) interface(s) 312. Communications fabric 302 can be implemented with any architecture designed for passing data and/or control information between processors (such as microprocessors, communications and network processors, etc.), system memory, peripheral devices, and any other hardware components within a system. For example, communications fabric 302 can be implemented with one or more buses.

Memory 306, cache memory 316, and persistent storage 308 are computer readable storage media. In this embodiment, memory 306 includes random access memory (RAM) 314. In another embodiment, the memory 306 can be flash memory. In general, memory 306 can include any suitable volatile or non-volatile computer readable storage media.

In some embodiments of the present invention, deep learning program 325 is included and operated by neuromorphic chip 322 as a component of computing device 305. In other embodiments, deep learning program 325 is stored in persistent storage 308 for execution by neuromorphic chip 322 in conjunction with one or more of the respective computer processors 304 via one or more memories of memory 306. In this embodiment, persistent storage 308 includes a magnetic hard disk drive. Alternatively, or in addition to a magnetic hard disk drive, persistent storage 308 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 308 can also be removable. For example, a removable hard drive can be used for persistent storage 308. Other examples include optical and magnetic disks, thumb drives, and smart cards that are inserted into a drive for transfer onto another computer readable storage medium that is also part of persistent storage 308.

Communications unit 310, in these examples, provides for communications with other data processing systems or devices, including resources of distributed data processing environment. In these examples, communications unit 310 includes one or more network interface cards. Communications unit 310 can provide communications through the use of either or both physical and wireless communications links. Deep learning program 325 can be downloaded to persistent storage 308 through communications unit 310.

I/O interface(s) 312 allows for input and output of data with other devices that can be connected to computing system 300. For example, I/O interface 312 can provide a connection to external devices 318 such as a keyboard, keypad, a touch screen, and/or some other suitable input device. External devices 318 can also include portable computer readable storage media such as, for example, thumb drives, portable optical or magnetic disks, and memory cards.

Display 320 provides a mechanism to display data to a user and can be, for example, a computer monitor.

Figure 11:
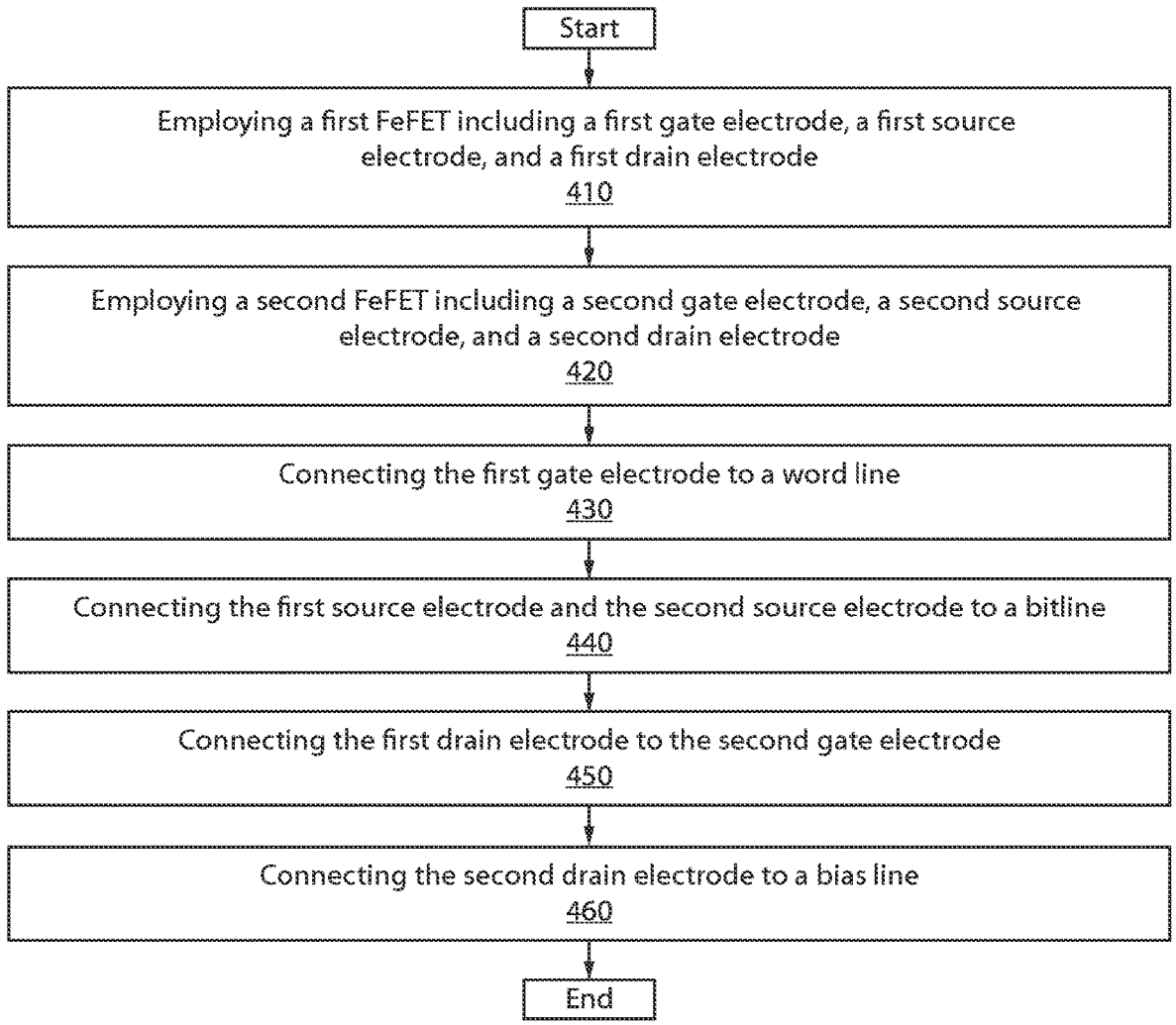
FIG. 11 is a block/flow diagram of a method for illustrating unit cell connections (two FeFETs), in accordance with an embodiment of the present invention.

FIG. 11 is a block/flow diagram of a method for illustrating unit cell connections (2 FeFETs), in accordance with an embodiment of the present invention.

At block 410, employ a first FeFET including a first gate electrode, a first source electrode, and a first drain electrode.

At block 420, employ a second FeFET including a second gate electrode, a second source electrode, and a second drain electrode.

At block 430, connect the first gate electrode to a wordline.

At block 440, connect the first source electrode and the second source electrode to a bitline.

At block 450, connect the first drain electrode to the second gate electrode.

At block 460, connect the second drain electrode to a bias line.

Figure 12:
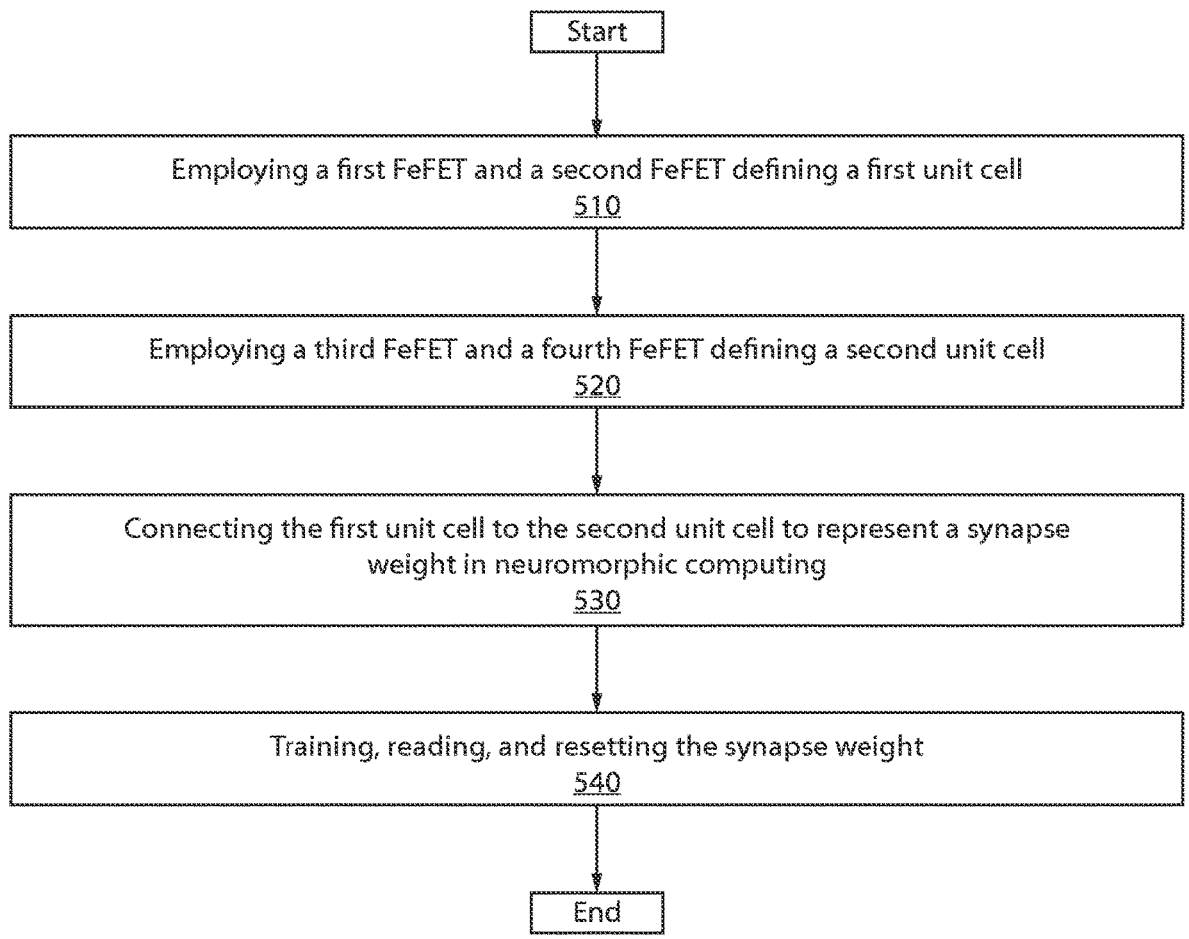
FIG. 12 is a block/flow diagram of a method for illustrating synapse weight connections (four FeFETs), in accordance with an embodiment of the present invention.

FIG. 12 is a block/flow diagram of a method for illustrating synapse weight connections (4 FeFETs), in accordance with an embodiment of the present invention.

At block 510, employ a first FeFET and a second FeFET defining a first unit cell.

At block 520, employ a third FeFET and a fourth FeFET defining a second unit cell.

At block 530, connect the first unit cell to the second unit cell to represent a synapse weight in neuromorphic computing.

At block 540, train, read, and reset the synapse weight.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and system for improving linearity for neuromorphic computing by employing a two FeFET unit-cell structure (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A circuit structure comprising:
a memory cell having a first ferroelectric field effect transistor (FeFET) including a first gate electrode, a first source electrode, and a first drain electrode; and a second FeFET including a second gate electrode, a second source electrode, and a second drain electrode;
wherein the first gate electrode is connected to a wordline; and
wherein the first source electrode and the second source electrode in the memory cell are connected to a same bitline.

2. The circuit structure of claim 1, wherein the first drain electrode is connected to the second gate electrode.

3. The circuit structure of claim 1, wherein the second drain electrode is connected to a bias line.

4. A weight synapse structure comprising:
a first circuit structure incorporated between a first wordline and a first bitline, wherein the first circuit structure includes a memory cell having a first ferroelectric field effect transistor (FeFET) and a first drain electrode connected to a second FeFET with source electrodes of the first FeFET and second FeFET both being connected to the first bitline; and
a second circuit structure incorporated between a second wordline and a second bitline, wherein the second circuit structure includes a third FeFET and a fourth FeFET, the first circuit structure electrically connected to the second circuit structure to define a single synapse.

5. The weight synapse structure of claim 4, wherein voltage pulses are applied to the first wordline and a bias voltage is applied to the first bitline to train the single synapse.

6. The weight synapse structure of claim 5, wherein the voltage pulses gradually change a threshold voltage of the first FeFET of the first circuit structure.

7. The weight synapse structure of claim 6, wherein the bias voltage modulates a channel conductance of the single synapse.

8. The weight synapse structure of claim 4, wherein a wordline reset voltage is applied to the first wordline to reset the single synapse.

9. The weight synapse structure of claim 4, wherein a bitline reset voltage is applied to the first bitline to reset the single synapse.

10. The weight synapse structure of claim 4, wherein a bitline read voltage is applied to the first bitline to read the single synapse.

11. A method comprising:
constructing a memory cell having a first ferroelectric field effect transistor (FeFET) including a first gate electrode, a first source electrode, and a first drain electrode;
constructing a second FeFET including a second gate electrode, a second source electrode, and a second drain electrode, the first and second FeFETs combined to form a first circuit structure, wherein the first drain electrode is connected to the second FeFET;
connecting the first gate electrode to a first wordline; and
connecting the first source electrode and the second source electrode in the memory cell to a same first bitline.

12. The method of claim 11, further comprising connecting the first drain electrode to the second gate electrode.

13. The method of claim 12, further comprising connecting the second drain electrode to a first bias line.

14. The method of claim 13, further comprising:
constructing a third FeFET including a third gate electrode, a third source electrode, and a third drain electrode;
constructing a fourth FeFET including a fourth gate electrode, a fourth source electrode, and a fourth drain electrode, the third and fourth FeFETs combined to form a second circuit structure;

connecting the third gate electrode to a second wordline; and connecting the third source electrode and the second source electrode to a same second bitline.

15. The method of claim 14, further comprising connecting the third drain electrode to the fourth gate electrode.

16. The method of claim 15, further comprising connecting the fourth drain electrode to a second bias line.

17. The method of claim 16, further comprising electrically connecting the first circuit structure to the second circuit structure for differential read of channel conductance values of the second and the fourth FeFETs to define a single synapse.

18. The method of claim 17, further comprising applying voltage pulses to the first wordline and applying a bias voltage to the first bitline to train the single synapse.

19. The method of claim 18, further comprising gradually changing a threshold voltage of the first FeFET of the first circuit structure and the third FeFET of the second circuit structure via the voltage pulses.

20. The method of claim 19, further comprising modulating a channel conductance of the single synapse via the bias voltage.

* * * * *